United States Patent [19]

Haque

[11] 4,320,347
[45] Mar. 16, 1982

[54] SWITCHED CAPACITOR COMPARATOR

[75] Inventor: Yusuf A. Haque, San Jose, Calif.

[73] Assignee: American Microsystems, Inc., Santa Clara, Calif.

[21] Appl. No.: 192,721

[22] Filed: Oct. 1, 1980

[51] Int. Cl.³ .......................... H03F 1/02; H03F 3/45
[52] U.S. Cl. ...................................... 330/9; 330/253; 330/257
[58] Field of Search ................... 330/9, 253, 257, 259, 330/260

[56] References Cited

U.S. PATENT DOCUMENTS 3,984,780  10/1976  Hsiao et al. ..................... 330/253

Primary Examiner—James B. Mullins
Assistant Examiner—Gene Wan
Attorney, Agent, or Firm—Alan H. MacPherson; Steven F. Caserza

[57] ABSTRACT

An operational amplifier is designed to eliminate the effects of inherent voltage affects when used as a voltage comparator, while maintaining a high slew rate and a fast response time by providing a feedback capacitor which can be connected and disconnected between the output terminal and the noninverting current mirror input leg.

2 Claims, 7 Drawing Figures

SWITCHED CAPACITOR COMPARATOR

BACKGROUND OF THE INVENTION

1. Field of the Invention

This invention relates to operational amplifier circuits utilized as voltage comparators and more particularly to an operational amplifier circuit utilizing methods to eliminate the effect of inherent offset voltages on its output lead when used as a voltage comparator.

2. Description of the Prior Art

The use of operational amplifiers to operate as voltage comparators is well known in the prior art. FIG. 1 shows a symbolic diagram of an operational amplifier. Operational amplifier 1 contains inverting input 2, noninverting input 3, and output 4. The comparator shown in FIG. 1 contains no means for providing feedback from output 4 to inverting input 2. Thus, the amplification factor of operational amplifier 1 will be very high. When a voltage is applied to noninverting input 3 which is more positive than the voltage applied to inverting input 2, operational amplifier 1 will amplify the positive difference in voltages appearing across inputs 2 and 3. Thus, output 4 will become very positive, being equal to the product of the input voltage difference times the gain of the amplifier, until the amplifier saturates. Because there is no feedback between output 4 and inputs 2 and 3, the gain of operational amplifier 1 will be very high, thus forcing output 4 to very nearly equal the value $V_{DD}$ of the positive supply voltage applied to operational amplifier 1. Similarly, when the voltage applied to noninverting input 3 is more negative than the voltage applied to inverting input 2, operational amplifier 1 will amplify greatly the negative voltage appearing across inputs 2 and 3, thus causing output 4 to become very negative, essentially equal to the value $V_{SS}$ of the negative voltage supply applied to operational amplifier 1. In this manner, if a positive voltage is applied across terminals 3 and 2 of operational amplifier 1, output 4 will become very positive. Similarly, if a negative voltage is applied across inputs 3 and 2 of operational amplifier 1, output 4 will become very negative. The relationship between input voltages and output voltage of an ideal operational amplifier used as a voltage comparator is shown in FIG. 2.

In actual operational amplifier circuits, finite component mismatches create voltage offsets. These voltage offsets are unique to each operational amplifier circuit, due to unique component mismatches. Thus, for example, in the operational amplifier in FIG. 1, an offset voltage may exist where a slightly positive voltage applied across inputs 3 and 2 will cause output 4 to become very negative. The relationship between the input voltage and the output voltage of an actual operational amplifier operated as a comparator is shown in FIG. 3. In FIG. 3, the point at which the comparator output switches from a negative voltage to a positive voltage is labeled $V_{off}$. Thus, for input voltages between 0 and $V_{off}$, the output of comparator 1 will be erroneous.

Attempts have been made in the prior art to eliminate the errors in comparators caused by offset voltages inherent in operational amplifiers. One such attempt is shown in the circuit of FIG. 4. In FIG. 4, operational amplifier 1 again contains inverting input 2, noninverting input 3 and output 4. Capacitor 5 is connected between inverting input 2 and ground, as shown. Inverting input 2 is connected to output 4 through switch 6, thus allowing operational amplifier 1 to operate in the unity gain mode when switch 6 is closed. In the operation of the circuit of FIG. 4 as a voltage comparator, an input voltage is applied to noninverting input 3, which is then compared to a reference voltage previously stored on capacitor 5 which is applied to inverting input 2. To store the reference voltage on capacitor 5, switch 6 is closed, thus placing operational amplifier 1 in the unity gain mode. The reference voltage to which later input voltages are to be compared is applied to noninverting input 3. At this point, an ideal operational amplifier will have the reference voltage appearing on output 4 applied to its inverting input 2 through switch 6. However, actual operational amplifiers will have the reference voltage minus the inherent offset voltage of the operational amplifier, $V_{off}$, on output 4 and thus applied to noninverting input 2 through switch 6. Thus, $V_{REF} - V_{OFF}$ is stored on capacitor 5. Switch 6 is then opened, thus allowing operational amplifier 1 to operate as a voltage comparator, with a very high amplification. If an input voltage greater than $V_{REF}$ is applied to noninverting input 3, output 4 will go very positive, approximately to the voltage level of the positive supply voltage ($V_{DD}$) applied to operational amplifier 1. Similarly, if a voltage less than $V_{REF}$ is applied to noninverting input 3, output 4 will go very negative, approximately equal to the voltage level of the negative supply voltage ($V_{SS}$) applied to operational amplifier 1.

A distinct disadvantage of the circuit of FIG. 4 is that in many instances, while attempting to store a reference voltage on capacitor 5 by placing operational amplifier 1 in the unity gain mode by closing switch 6, the signal on output 4 is more than 180° out of phase with the voltage appearing on input 3. This phase difference causes positive feedback, thereby causing instability and causing output 4, and thus the voltage stored on capacitor 5, to become either extremely positive or extremely negative. In this fashion, the voltage stored on capacitor 5 will not be equal to $V_{REF} - V_{OFF}$, and operational amplifier 1 will not function properly as a voltage comparator.

A detailed circuit diagram of a prior art operational amplifier utilizing MOS technology is shown in FIG. 5. A positive supply voltage, denoted as $V_{DD}$, is connected to terminal 40. A negative supply voltage, designated as $V_{SS}$, is connected to terminal 42. Bias generator 51, containing MOS transistors 11 and 12, operates to generate a fixed bias voltage at node 88. This bias voltage is applied to gate 9 of current source transistor 16, contained within current mirror differential amplifier input stage 52, as shown. This causes a constant current to flow through lead 8. Input terminals 2 and 3 are connected to current mirror MOS transistors 15 and 17, respectively. Transistors 18, 19 and 20 form level shift stage 53, as shown. Level shift stage 53 allows operational amplifier 1 to operate as a class AB amplifier, thereby having lower power dissipation over operational amplifiers that do not utilize a level shift stage, which operate as class A amplifiers. Transistors 21 and 22 form output stage 54 as shown, with terminal 4 available as the source of the output signal from operational amplifier 1.

FIG. 6 shows a detailed schematic diagram of an operational amplifier used as a voltage comparator connected as shown in FIG. 4. Circuit elements common to both FIG. 5 and FIG. 6 are numbered similarly. However, the circuit of FIG. 6 has several additional elements. Gate 7 of input current mirror transistor 15 is internally connected via lead 2 to node 74. Capacitor 108 is connected between node 74 and ground, and serves to store a reference voltage for use when operational amplifier 1 is used as a voltage comparator. Node 74 is also connected to output 4 at node 73 through transmission gate 107 comprised of a complimentary pair of MOS transistors 105 and 106 as shown. When a logical low is placed on input node 43, P-channel MOS transistor 105 turns on. At the same time, a logical high is placed on node 75 by inverter 109, thus causing N-channel MOS transistor 106 to turn on. Thus, transmission gate 107 will conduct, effectively connecting output node 73 to gate 7 of input transistor 15 and reference voltage storage capacitor 108. This places operational amplifier 1 in the unity gain mode. With a reference voltage $V_{REF}$ applied to input terminal 3, the voltage stored on capacitor 108 will be $V_{REF}-V_{OFF}$, where $V_{OFF}$ is the offset voltage of operational amplifier 1.

In addition, capacitor 101 is permanently connected between node 71 in differential amplifier input stage 52, and output node 73. This capacitor reduces the phase shift between the signal appearing on output node 73 and input node 71 to less than 180°, thus providing negative feedback between output stage 54 and differential amplifier input stage 52. This negative feedback guarantees stability when operational amplifier 1 is placed in the unity gain mode by placing a low on input terminal 43 causing transmission gate 107 to conduct. This stability is guaranteed irrespective of the value of load capacitor 108. Thus, the prior art circuit of FIG. 6 overcomes the disadvantages of the prior art circuit of FIG. 4 and the prior art circuit of FIG. 5 by utilizing both a storage capacitor for storing $V_{REF}-V_{OFF}$ for use on one input, while adding capacitor 101 to guarantee stability such that operational amplifier 1 will function properly in the unity gain mode. However, the addition of capacitor 101 decreases response time of operational amplifier 1 by decreasing the slew rate. The slew rate is equal to $I_1/C_1$, where $I_1$ is equal to the current flowing through current source transistor lead 8, and $C_1$ is equal to the capacitance of capacitor 101 plus any parasitic capacitance appearing on node 71. This decreased slew rate is a distinct disadvantage of prior art operational amplifier circuits operating as comparators utilizing voltage offset compensation means.

SUMMARY OF THE INVENTION

This invention utilizes an operational amplifier as a voltage comparator. The initialization period occurs when it is desired to store a reference voltage $V_{REF}$ in the comparator for later use. During the initialization period of the operational amplifier, a reference voltage is supplied to one input lead of the operational amplifier, and the second input lead is connected to the operational amplifier output lead, thus causing the operational amplifier to operate in the unity gain mode. A storage capacitor is connected between operational amplifier output lead and ground for storing a voltage equal to the reference voltage minus the inherent offset voltage of the operational amplifier. During this initialization period, a second storage capacitor is also switched in between the noninverting leg of a current mirror differential amplifier input stage of the operational amplifier and the output lead of the operational amplifier. This second storage capacitor reduces the phase shift between the output signal and the input signal to less than 180°, thereby providing negative feedback which guarantees the operational amplifier will be stable and thus function properly while in the unity gain mode. Once the reference voltage minus the offset voltage is stored during the initialization period, the storage capacitor is disconnected from the output of the operational amplifier, but remains connected to the inverting input lead of the operational amplifier. Furthermore, the second input capacitor is disconnected between the noninverting leg of the current mirror differential amplifier input stage and the output lead of the operational amplifier when the operational amplifier is to be used as a comparator, thus improving the slew rate and response time over that of prior art comparators utilizing offset voltage compensation.

DETAILED DESCRIPTION OF THE INVENTION

Figure 1:
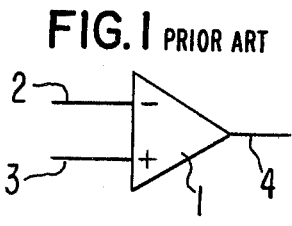
FIG. 1 is a symbolic diagram of an operational amplifier capable of being used as a voltage comparator.
Figure 4:
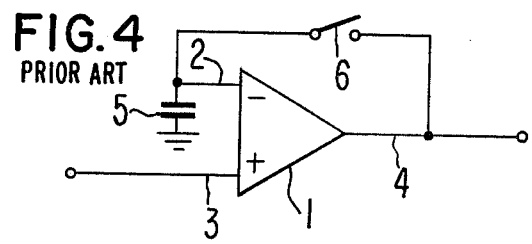
FIG. 4 is a symbolic diagram showing one prior art method of attempting to eliminate the effects of operational amplifier voltage offsets on the input of an operational amplifier utilized as a voltage comparator.
Figure 2:
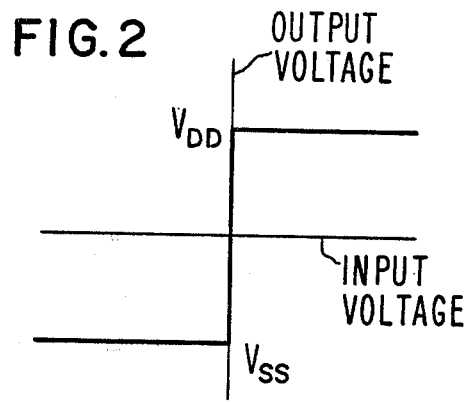
FIG. 2 is a graphical representation of the relationship between the input voltage and the output voltage of an ideal operational amplifier when used as a voltage comparator.
Figure 3:
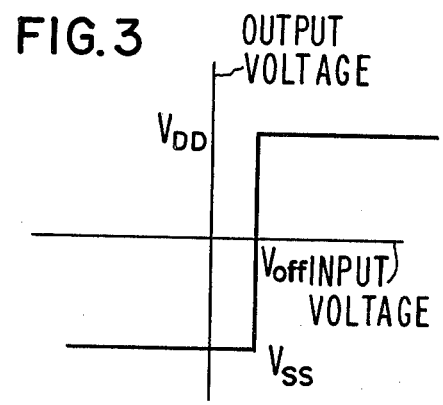
FIG. 3 is a graphical representation of the relationship between the input voltage and the output voltage of an actual operational amplifier of FIG. 1 when used as a voltage comparator.
Figure 5:
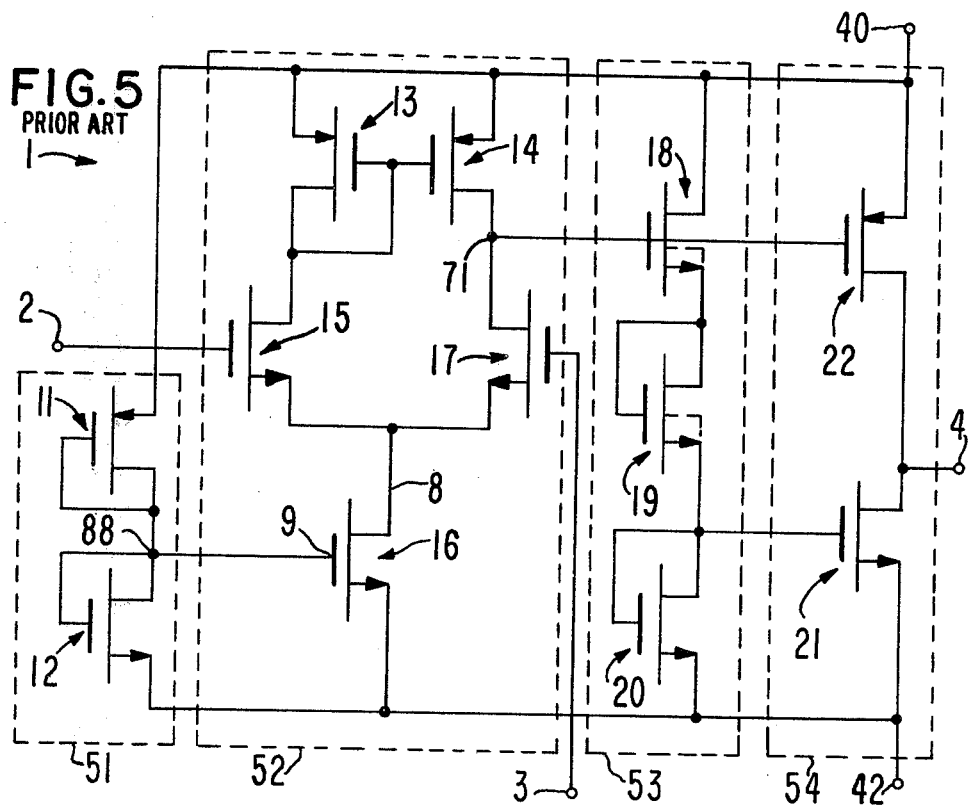
FIG. 5 is a schematic diagram of a prior art operational amplifier utilizing MOS technology, which is capable of being used as a voltage comparator.
Figure 6:
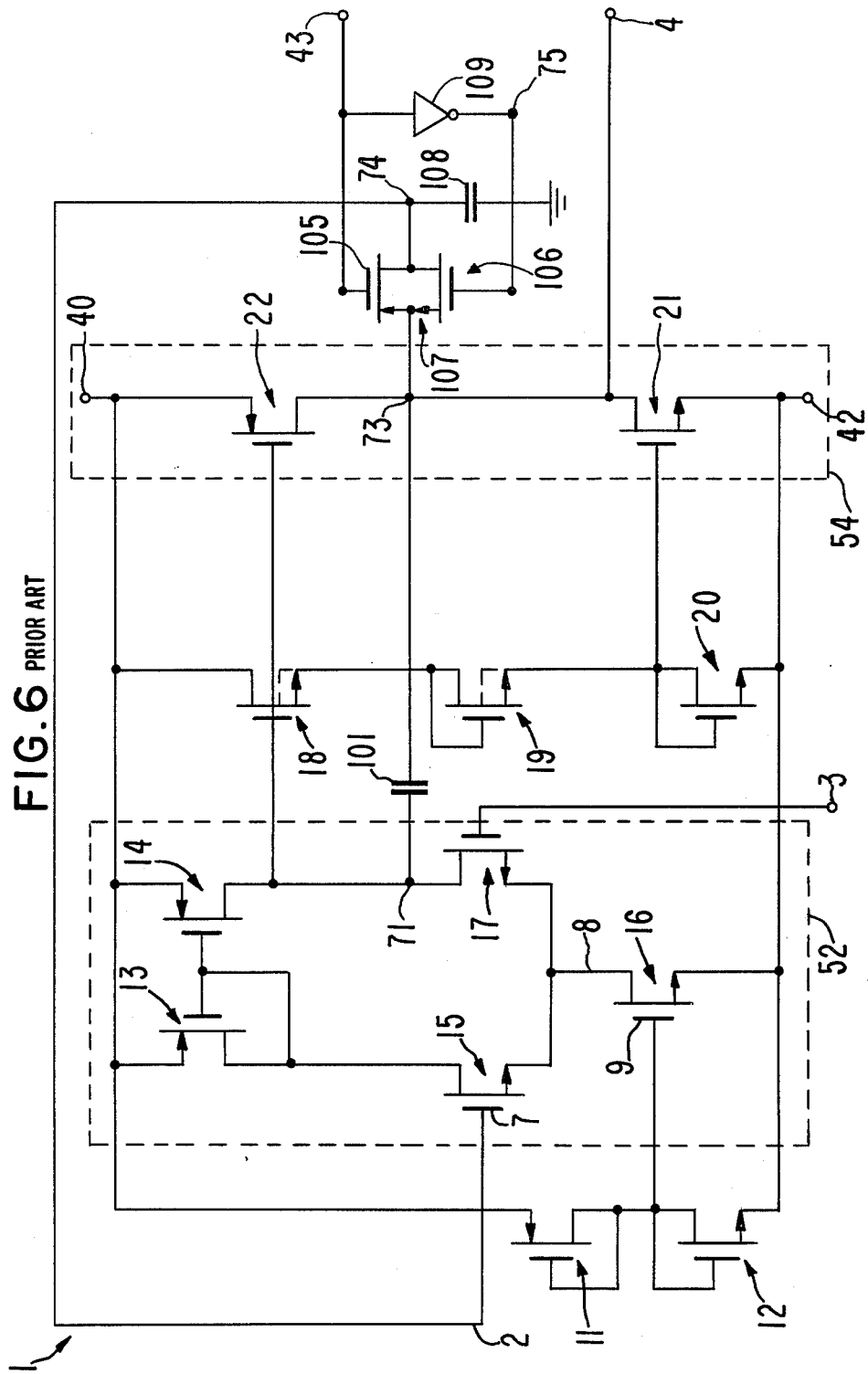
FIG. 6 is a schematic diagram of a prior art operational amplifier used as a voltage comparator utilizing a prior art method of attempting to eliminate the effects on output voltage of voltage offsets inherent in operational amplifiers.
Figure 7:
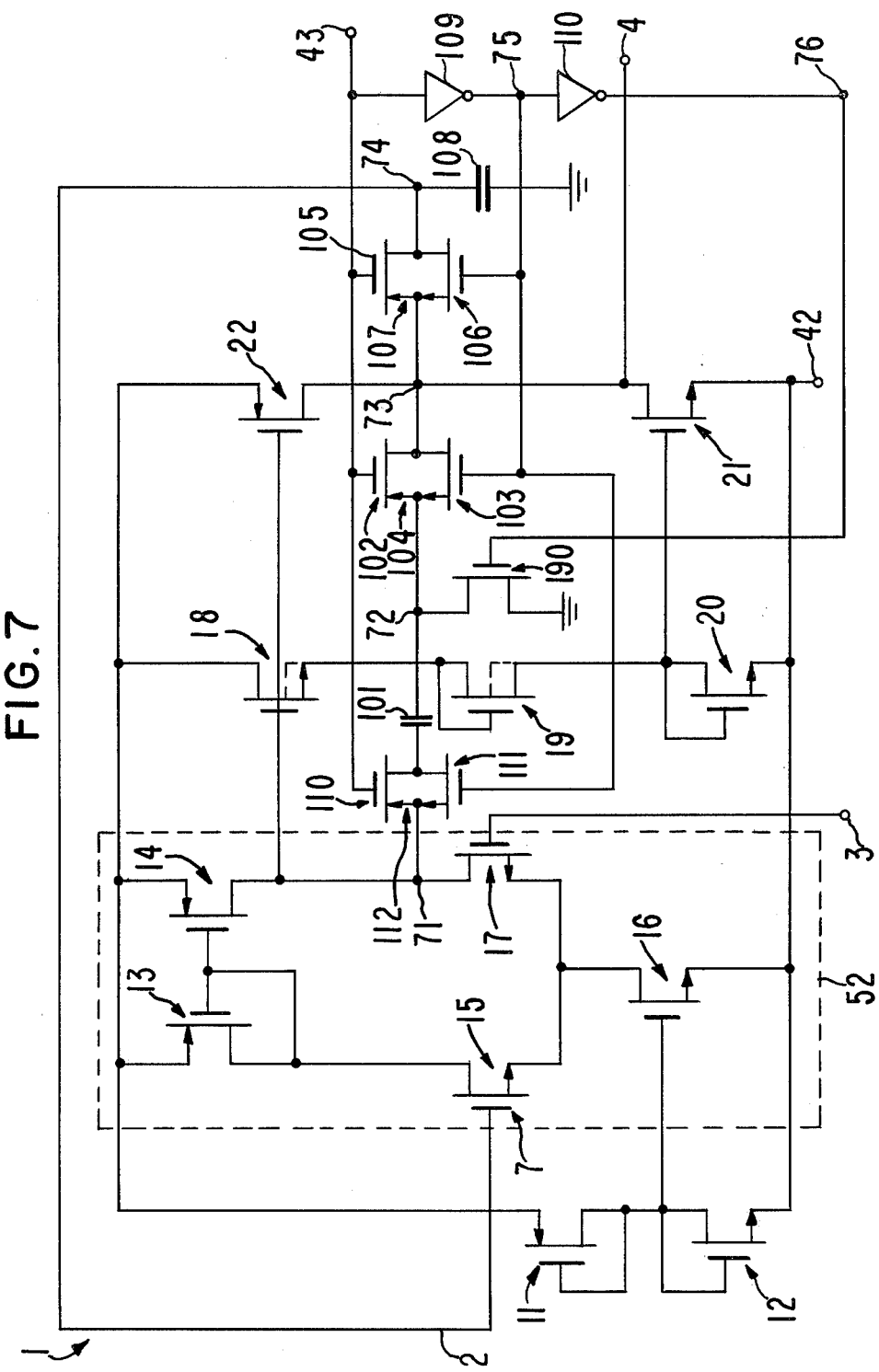
FIG. 7 is a schematic diagram of an operation amplifier used as a voltage comparator constructed in accordance with the present invention.

FIG. 7 shows a schematic diagram of an operational amplifier used as a voltage comparator utilizing the techniques of this invention. Terminal 43 is available to receive an external signal indicative of the operational state of the comparator. A logical low is placed on terminal 43 when it is desired to initialize the voltage comparator. Initialization of the comparator occurs when it is desired to store a reference voltage $V_{REF}$ in the comparator for later use. During the initialization period, $V_{REF}$ is applied to input terminal 3, and a logical low is placed on terminal 43. A low on terminal 43 causes P-channel transistor 105 to conduct. With a logical low on input terminal 43, a logical high is generated at node 75 by inverter 109. This logical high causes N-channel MOS transistor 106 to conduct. Thus, both transistors 105 and 106 forming transmission gate 107 conduct. With transmission gate 107 on, output node 73 is connected to inverting input current mirror transistor 15 via lead 2. This places the operational amplifier in the unity gain mode, resulting in $V_{REF}-V_{OFF}$ appearing at output node 73 and output terminal 4. Due to the conduction of transmission gate 107, $V_{REF}-V_{OFF}$ is also stored on capacitor 108.

In order to insure that operational amplifier 1 will be stable, and thus function properly in the unity gain mode, capacitor 101 is used to provide feedback from output node 73 to node 71 located in the noninverting leg of current mirror differential input stage 52. The insertion of capacitor 101 between output node 73 and input node 71 prevents the output signal available at node 73 from being more than 180° out of phase with the input signal at node 71, thus preventing positive feedback and thus insuring that operational amplifier 1 will function properly when in the unity gain mode. Capacitor 101 is inserted between input node 71 and output node 73 by the use of transmission gates 112 and 104. Transmission gate 104 consists of P-channel MOS transistor 102 and N-channel transistor 103. Similarly transmission gate 112 consists of P-channel transistor 110 and N-channel transistor 111. With a low applied at input terminal 43, P-channel transistors 102 and 110 turn on. Similarly a high is generated on node 75 by inverter 109, thus causing N-channel transistors 103 and 111 to turn on. Thus, during the initialization stage, transmission gates 104 and 112 conduct, thus effectively connecting capacitor 101 between input node 71 and output node 73.

During operation of operational amplifier 1 as a voltage comparator, a high is placed on input terminal 43. This generates a logical low on node 75 by inverter 109, and a logical high on node 76 by inverter 110. A logical high on input terminal 43 causes P-channel transistors 110, 102, and 105 to turn off. A logical low on node 75 causes N-channel transistors 111, 103, and 106 to turn off. This causes transmission gates 112, 104, and 107 to stop conducting. With transmission gate 107 not conducting, output node 73 is effectively disconnected from inverting input current mirror transistor 15, thus removing operational amplifier 1 from the unity gain mode. At this time, $V_{REF}-V_{OFF}$ remains stored on capacitor 108. This $V_{REF}-V_{OFF}$ is thus applied via lead 2 to inverting input current mirror transistor 15, thus allowing subsequent voltages applied to input terminal 3 to be compared against the stored $V_{REF}-V_{OFF}$, resulting in an accurate output signal at output terminal 4 without an error included due to the effects of $V_{OFF}$. Thus, the output signal at terminal 4 will be indicative of whether the input signal on terminal 3 is more positive or more negative than $V_{REF}$.

With a high placed on input terminal 43 during operation of operational amplifier 1 as a voltage comparator, P-channel transistors 110 and 102 turn off. With a low generated on node 75 by inverter 109, N-channel transistors 111 and 103 turn off. Thus, transmission gates 112 and 104 cease to conduct, effectively disconnecting capacitor 101 from input node 71 and output node 73. At the same time, the logical high generated on node 76 by inverter 110 causes N-channel transistor 190 to turn on, thus grounding capacitor 101. Thus, utilizing the technique of this invention, capacitor 101 is switched into the operational amplifier circuit between output terminal 73 and input terminal 71 to prevent positive feedback during the initialization phase, when it is desired to guarantee stability and thus proper functioning of operational amplifier 1 in the unity gain mode. Similarly, capacitor 101 is switched out of the operational amplifier circuit during operation of operational amplifier 1 as a voltage comparator, thus increasing the slew rate and increasing response time of the voltage comparator over prior art voltage comparators which attempt to provide means for cancellation of the effects of offset voltages inherent in operational amplifiers by permanently connecting a capacitor between output and input stages of the operational amplifier to prevent positive feedback during operation of the operational amplifier in the unity gain mode.

I claim:

1. A voltage comparator circuit comprising:

an operational amplifier having an inherent offset voltage, said amplifier containing an inverting current mirror differential input leg having an inverting input terminal, a noninverting current mirror differential input leg having a noninverting input terminal, and an output terminal;

means for storing a voltage equal to a reference voltage minus said inherent offset voltage of said operational amplifier including;

(a) switch means connected between said inverting input terminal and said output terminal;

(b) a storage capacitor connected between said inverting input terminal and ground; and (c) means for preventing positive feedback by capacitively coupling said output terminal to said noninverting current mirror differential input leg only when storing said voltage; and means for applying said stored voltage to said inverting input of said operational amplifier, wherein the output signal available on said operational amplifier output terminal will be indicative of whether the voltage applied to said noninverting input terminal is greater than or less than said reference voltage.

2. A method for eliminating the effects of inherent offset voltages when using, as a voltage comparator, an operational amplifier containing an inverting current mirror differential input leg having an inverting input terminal, a noninverting current mirror differential input leg having a noninverting input terminal, an output terminal, and a storage capacitor connected between said inverting input terminal and ground comprising the steps of:

(a) connecting said output terminal to said inverting input terminal;

(b) connecting a feedback capacitor between said output terminal and said noninverting current mirror differential input leg;

(c) applying a reference voltage on said noninverting input terminal, thereby causing a voltage equal to said reference voltage minus said operational amplifier offset voltage to be generated on said output terminal and stored in said storage capacitor;

(d) disconnecting said output terminal from said inverting input terminal;

(e) disconnecting said feedback capacitor from said output terminal and said noninverting current mirror differential input leg;

(f) removing said reference voltage from noninverting input terminal;

(g) applying an input signal to said noninverting input terminal, whereby the output signal generated on said output terminal is indicative of whether said input signal is greater than or less than said reference voltage.

* * * * *

UNITED STATES PATENT AND TRADEMARK OFFICE
CERTIFICATE OF CORRECTION

PATENT NO. : 4,320,347
DATED : March 16, 1982
INVENTOR(S) : Yusuf A. Haque

It is certified that error appears in the above—identified patent and that said Letters Patent is hereby corrected as shown below:

Column 2, line 18, delete "$V_{OFF}$" and insert --$V_{off}$--;

Column 2, line 40, delete "$V_{OFF}$" and insert --$V_{off}$--;

Column 3, line 18, delete "$V_{OFF}$" and insert --$V_{off}$--;

Column 3, line 19, delete "$V_{OFF}$" and insert --$V_{off}$--;

Column 3, line 34, delete "$V_{OFF}$" and insert --$V_{off}$--;

Column 4, line 30, delete "input" and insert --output--;

Column 4, line 40, delete "operation" and insert --operational--;

Column 4, line 65, delete "$V_{OFF}$" and insert --$V_{off}$--;

Column 4, line 67, delete "$V_{OFF}$" and insert --$V_{off}$--;

Column 5, line 37, delete "$V_{OFF}$" and insert --$V_{off}$--;

Column 5, line 38, delete "$V_{OFF}$" and insert --$V_{off}$--;

Column 5, lines 41-42, delete "$V_{OFF}$" and insert --$V_{off}$--;

Column 5, line 44, delete "$V_{OFF}$" and insert --$V_{off}$--;

UNITED STATES PATENT AND TRADEMARK OFFICE
CERTIFICATE OF CORRECTION

PATENT NO. : 4,320,347
DATED : March 16, 1982
INVENTOR(S) : Yusuf A. Haque

It is certified that error appears in the above-identified patent and that said Letters Patent is hereby corrected as shown below:

Column 6, line 59, between "from" and "noninvert-" insert

-- said --.

Signed and Sealed this

Seventh Day of December 1982

[SEAL]

Attest:

Attesting Officer

GERALD J. MOSSINGHOFF

Commissioner of Patents and Trademarks